United States Patent
Ryu et al.

(10) Patent No.: US 12,217,821 B2
(45) Date of Patent: Feb. 4, 2025

(54) STORAGE DEVICE AND OPERATING METHOD WITH MULTIPLE CHANNELS

(71) Applicant: SK hynix Inc., Gyeonggi-do (KR)

(72) Inventors: Seung Han Ryu, Gyeonggi-do (KR); In Bo Shim, Gyeonggi-do (KR); Hyeong Rak Kim, Gyeonggi-do (KR); Hae Seong Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 129 days.

(21) Appl. No.: 17/831,969

(22) Filed: Jun. 3, 2022

(65) Prior Publication Data

US 2023/0238040 A1    Jul. 27, 2023

(30) Foreign Application Priority Data

Jan. 25, 2022    (KR) .................. 10-2022-0010798

(51) Int. Cl.
*G11C 7/10*    (2006.01)

(52) U.S. Cl.
CPC ............ *G11C 7/1087* (2013.01); *G11C 7/109* (2013.01); *G11C 7/1093* (2013.01)

(58) Field of Classification Search
CPC ..... G11C 7/1087; G11C 7/109; G11C 7/1093; G11C 7/222; G11C 7/22; G11C 5/04; G11C 8/12; G11C 8/06; G11C 8/18; G11C 16/08; G11C 16/10; G06F 13/1684; G06F 12/0653; G06F 12/0246; G06F 12/02; G06F 2212/7201; G06F 2212/7208
See application file for complete search history.

(56) References Cited

U.S. PATENT DOCUMENTS

| | | | |
|---|---|---|---|
| 8,762,621 B2 | 6/2014 | Manning | |
| 11,080,218 B2* | 8/2021 | Yang | ....................... G11C 16/08 |
| 11,749,358 B2* | 9/2023 | Suzuki | .................. G06F 3/0611 |
| | | | 365/233.14 |
| 2016/0118088 A1* | 4/2016 | Lee | ........................ G11C 16/08 |
| | | | 365/191 |
| 2023/0092551 A1* | 3/2023 | Sato | ..................... G11C 11/4096 |
| | | | 365/189.011 |

FOREIGN PATENT DOCUMENTS

KR    10-2010-0133613 A    12/2010

* cited by examiner

*Primary Examiner* — Sultana Begum
(74) *Attorney, Agent, or Firm* — IP & T GROUP LLP

(57) ABSTRACT

A storage device includes a memory device including a plurality of memory dies; and a memory controller for addressing a memory die among the plurality of memory dies by using an address latch enable (ALE) signal and a command latch enable (CLE) signal, which are input during predetermined N cycles, where N is a natural number, and controlling the memory device such that the memory die performs a memory operation. The memory controller may address the memory die by addressing a channel among a plurality of channels respectively connected to a plurality of package groups by using a chip enable (CE) signal.

22 Claims, 14 Drawing Sheets

STORAGE DEVICE AND OPERATING METHOD WITH MULTIPLE CHANNELS

CROSS-REFERENCE TO RELATED APPLICATION

The present application claims priority under 35 U.S.C. § 119(a) to Korean patent application number 10-2022-0010798, filed on Jan. 25, 2022, the entire disclosure of which is incorporated herein by reference.

BACKGROUND

1. Field of Invention

The present disclosure generally relates to a storage device, and more particularly, to a storage device including a memory device and a memory controller.

2. Description of Related Art

A storage device is a device which stores data under the control of a host device such as a computer or a smart phone. The storage device may include a memory device for storing data and a memory controller for controlling the memory device. The memory device is classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Various embodiments of the present disclosure provide a storage device for supporting improved addressing for a high capacity memory and an operating method of the storage device.

In accordance with an aspect of the present disclosure, there is provided a storage device including: a memory device including a plurality of memory dies; and a memory controller configured to address a memory die among the plurality of memory dies by using an address latch enable (ALE) signal and a command latch enable (CLE) signal, which are input during predetermined N cycles, where N is a natural number, and control the memory device such that the memory die performs a memory operation, wherein the memory controller addresses the memory die by addressing a channel among a plurality of channels respectively connected to a plurality of package groups by using a chip enable (CE) signal.

In accordance with another aspect of the present disclosure, there is provided a storage device including: a memory device including a plurality of memory dies; and a memory controller configured to address a memory die among the plurality of memory dies by using an address latch enable (ALE) signal and a command latch enable (CLE) signal, which are input during a predetermined time, and control the memory device such that the memory die performs a memory operation, wherein the memory controller addresses the memory die by addressing a channel among a plurality of channels respectively connected to a plurality of package groups by using a chip enable (CE) signal.

In accordance with still another aspect of the present disclosure, there is provided a method of operating a storage device including a plurality of memory dies, the method including: addressing a memory die among the plurality of memory dies by using an address latch enable (ALE) signal and a command latch enable (CLE) signal, which are input during predetermined N cycles, where N is a natural number; and controlling the memory die to perform a memory operation, wherein, the addressing of the memory die includes addressing a channel corresponding to the memory die among a plurality of channels respectively connected to a plurality of package groups by using a chip enable (CE) signal.

In accordance with another aspect of the present disclosure, there is provided an operating method of a memory device, the operating method including: selecting, in response to a chip enable (CE) signal, a package group of a plurality of package groups included in the memory device; selecting sequentially, in response to respective toggles of an address latch enable (ALE) signal and a command latch enable (CLE) signal during first to third time periods, a memory package within the selected package group, an interface within the selected memory package and a memory die group coupled to the selected interface; and performing, in response to a combination of data (DQ) signal and the ALE and CLE signals during a fourth time period, an operation on a memory die within the selected memory die group.

In accordance with another aspect of the present disclosure, there is provided an operating method of a controller, the operating method including: selecting, by providing a memory device with a chip enable (CE) signal, a package group of package groups included in the memory device; selecting sequentially, by providing the memory device with respective toggles of an address latch enable (ALE) signal and a command latch enable (CLE) signal during first to third time periods, a memory package within the selected package group, an interface within the selected memory package and a memory die group coupled to the selected interface; and controlling, by providing the memory device with a combination of data (DQ) signal and the ALE and CLE signals during a fourth time period, the memory device to perform an operation on a memory die within the selected memory die group.

BRIEF DESCRIPTION OF THE DRAWINGS

Various embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
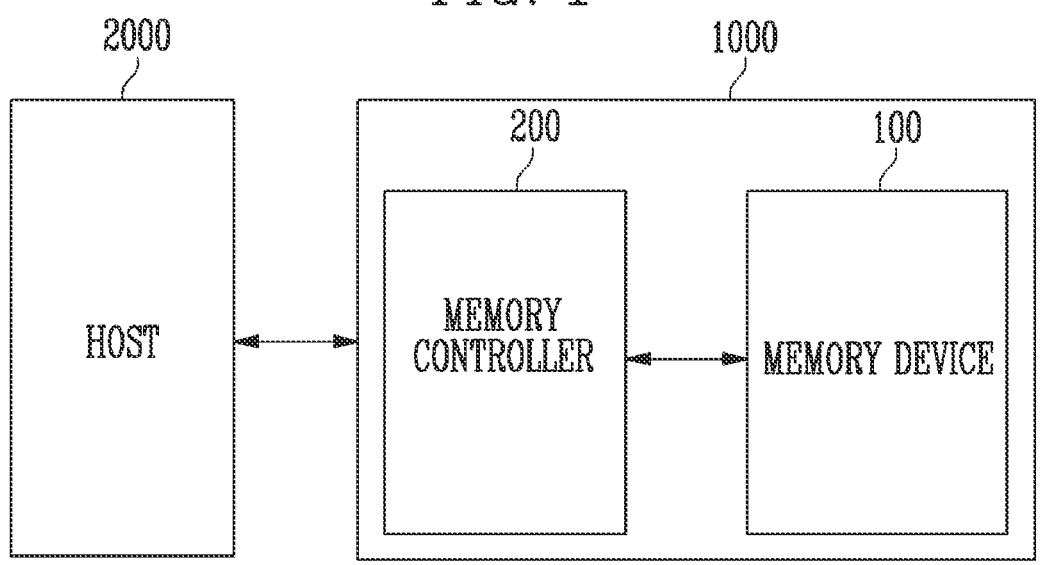
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 1000 may include a memory device 100 and a memory controller 200.

The storage device 1000 may be a device for storing data under the control of a host 2000, such as a mobile phone, a smart phone, an MP3 player, a laptop computer, a desktop computer, a game console, a display device, a tablet PC or an in-vehicle infotainment.

The storage device 1000 may be manufactured as any of various types of storage devices according to a host interface that is a communication scheme with the host 2000. For example, the storage device 1000 may be implemented with any of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 1000 may be implemented as any of various package types. For example, the storage device 1000 may be implemented as any of various package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data or use stored data. The memory device 100 operates under the control of the memory controller 200. Also, the memory device 100 may include a plurality of memory dies, and each of the plurality of memory dies may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks. Each memory block may include a plurality of memory cells, and one memory block may include a plurality of pages. The page may be a unit for storing data in the memory device 100 or reading data stored in the memory device 100.

The memory device 100 may be implemented as a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, for convenience of description, a case where the memory device 100 is a NAND flash memory is described.

The memory device 100 may receive a command and an address from the memory controller 200. The memory device 100 may access an area selected by the received address in the memory cell array. That the memory device 100 accesses the selected area may mean that the memory device 100 performs an operation corresponding to the received command on the selected area. For example, the memory device 100 may perform a write operation (program operation), a read operation, and an erase operation. The program operation may be an operation in which the memory device 100 records data in the area selected by the address. The read operation may mean an operation in which the memory device 100 reads data from the area selected by the address. The erase operation may mean an operation in which the memory device 100 erases data stored in the area selected by the address.

The memory controller 200 may control overall operations of the storage device 1000. Specifically, when power is applied to the storage device 1000, the memory controller 200 may execute firmware (FW). The FW may include a Host Interface Layer (HIL) which receives a request input from the host 2000 or outputs a response to the host 2000, a Flash Translation Layer (FTL) which manages an operation between an interface of the host 2000 and an interface of the memory device 100, and a Flash Interface Layer (FIL) which provides a command to the memory device 100 or receives a response from the memory device 100.

The memory controller 200 may receive data and a Logical Address (LA) from the host 2000, and translate the LA into a Physical Address (PA) representing an address of memory cells in which data included in the memory device 100 is to be stored. The LA may be a Logical Block Address (LBA), and the PA may be a Physical Block Address (PBA).

The memory controller 200 may control the memory device 100 to perform a program operation, a read operation, an erase operation, or the like in response to a request from the host 2000. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

The memory controller 200 may control the memory device 100 to autonomously perform a program operation, a read operation, or an erase operation regardless of any request from the host 2000. For example, the memory controller 200 may control the memory device 100 to perform a program operation, a read operation, or an erase operation, which is used to perform a background operation such as wear leveling, garbage collection, or read reclaim.

The host 2000 may communicate with the storage device 1000, using at least one of various communication standards or interfaces, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

Figure 2:
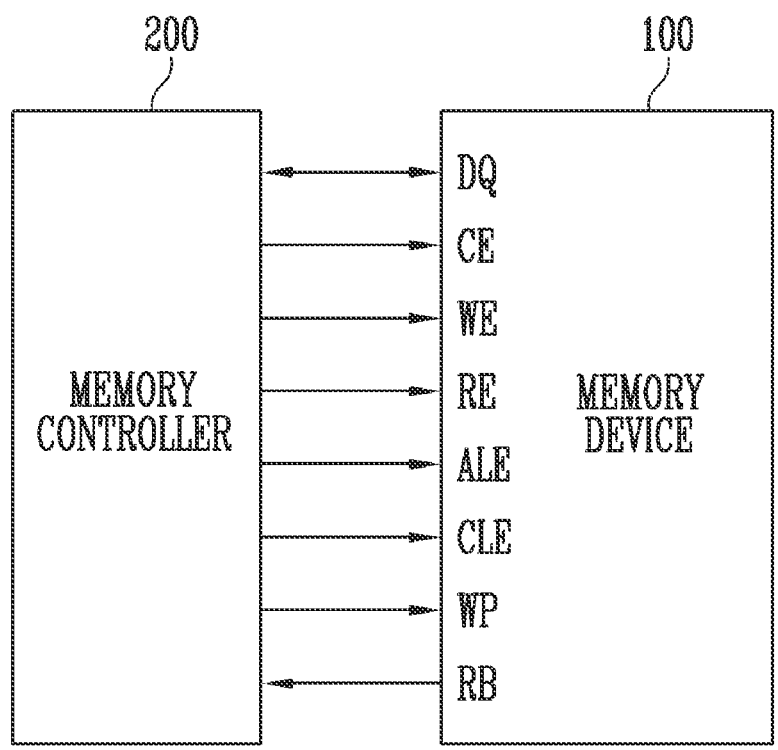
FIG. 2 is a diagram illustrating signals exchanged between a memory device and a memory controller in accordance with an embodiment of the present disclosure.

FIG. 2 is a diagram illustrating signals exchanged between the memory device and the memory controller in accordance with an embodiment of the present disclosure.

Referring to FIG. 2, the memory device 100 may communicate with the memory controller 200 through a data (DQ) line, a chip enable (CE) line, a write enable (WE) line, a read enable (RE) line, an address latch enable (ALE) line, a command latch enable (CLE) line, a write protect (WP) line, and a ready/busy (RB) line.

In FIG. 2, a connection relationship between one memory device 100 and the memory controller 200 is illustrated. However, in some embodiments, the present disclosure may be equally applied to a connection relationship between the memory controller 200 and a plurality of memory devices (e.g., a plurality of memory dies). For example, the data (DQ) line, the chip enable (CE) line, the write enable (WE) line, the read enable (RE) line, the address latch enable (ALE) line, the command latch enable (CLE) line, the write protect (WP) line, and the ready/busy (RB) line may be included in one channel, and the memory controller 200 and a plurality of memory devices (e.g., a plurality of memory dies) may be connected to each other through the corresponding channel. Therefore, when the memory controller 200 transmits signals through lines included in one channel, all memory devices connected to the corresponding channel or a memory device selected by the memory controller 200 among the memory devices connected to the corresponding channel may receive the signals.

The data (DQ) line may input a command, an address, and data from the memory controller 200 to the memory device 100, or output data from the memory device 100 to the memory controller 200. The data (DQ) line may be configured with 8 lines to transmit/receive 8-bit data, and each line may transmit/receive 1-bit data. However, the number of data (DQ) lines is not limited to 8, and may be extended to 16 or 32 in various embodiments.

The chip enable (CE) line may transfer a chip enable (CE) signal as a signal representing that the memory device 100 is operable. The chip enable (CE) signal may be selectively applied to memory devices connected to the same channel. When the chip enable (CE) signal falls to low, the chip enable (CE) signal may represent that all operations in a corresponding memory device 100 are possible. When the chip enable (CE) signal is high, the chip enable (CE) signal may represent that the corresponding memory device 100 is in a standby state. In accordance with an embodiment of the present disclosure, the storage device 1000 may address a plurality of memory dies connected to one channel among the plurality of channels by using the chip enable (CE) signal. That is, the storage device 1000 may transmit the chip enable (CE) signal at a low level to only a memory die connected to a specific channel among the plurality of channels, thereby addressing the specific channel.

The memory device 100 may receive a read enable (RE) signal through the read enable (RE) line, and receive a write enable (WE) signal through the write enable (WE) line. The read enable (RE) signal may be toggled when data is loaded to the memory controller 200, and the write enable (WE) signal may be toggled when a command and an address are loaded to the memory device 100. In an embodiment, the command and the address may be input to a selected memory device 100, when the write enable (WE) signal is changed from low to high, i.e., at a rising edge of the write enable (WE) signal. In an embodiment, the command and the address may be input to the selected memory device 100 when the write enable (WE) signal is changed from high to low, i.e., at a falling edge of the write enable (WE) signal. In an embodiment, the command and the address may be input to the selected memory device 100 when the write enable (WE) signal is changed from low to high and when the write enable (WE) signal is changed from high to low, i.e., at both the rising edge and the falling edge of the write enable (WE) signal.

The command latch enable (CLE) line may transfer a command latch enable (CLE) signal for inputting a command. Specifically, the memory device 100 may receive the command latch enable (CLE) signal from the memory controller 200 through the command latch enable (CLE) line. In addition, while the command is input to the memory device 100, the command latch enable (CLE) signal may become high. In accordance with an embodiment of the present disclosure, the storage device 1000 may address one memory die among the plurality of memory dies by using the command latch enable (CLE) signal.

The address latch enable (ALE) line may transfer an address latch enable (ALE) signal for inputting an address. Specifically, the memory device 100 may receive the address latch enable (ALE) signal from the memory controller 200 through the address latch enable (ALE) line. While the address is input to the memory device 100, the address latch enable (ALE) signal may become high. In accordance with an embodiment of the present disclosure, the storage device 1000 may address one memory die among the plurality of memory dies by using the address latch enable (ALE) signal.

The memory device 100 may receive a write protect (WP) signal through the write protect (WP) line. The write protect (WP) signal may be a signal for inactivating program and erase operations of the memory cell array.

While an operation is performed inside the memory device 100, a ready/busy (RB) signal transferred to the ready/busy (RB) line may have a low state. When the ready/busy (RB) signal is in the low state, the memory device 100 may not exchange any signal with the outside. When the ready/busy (RB) signal is high, the memory device 100 may represent that the memory device 100 is in a ready state. When the memory device 100 is in the ready state, the memory device 100 may exchange a signal with the outside.

Figure 3:
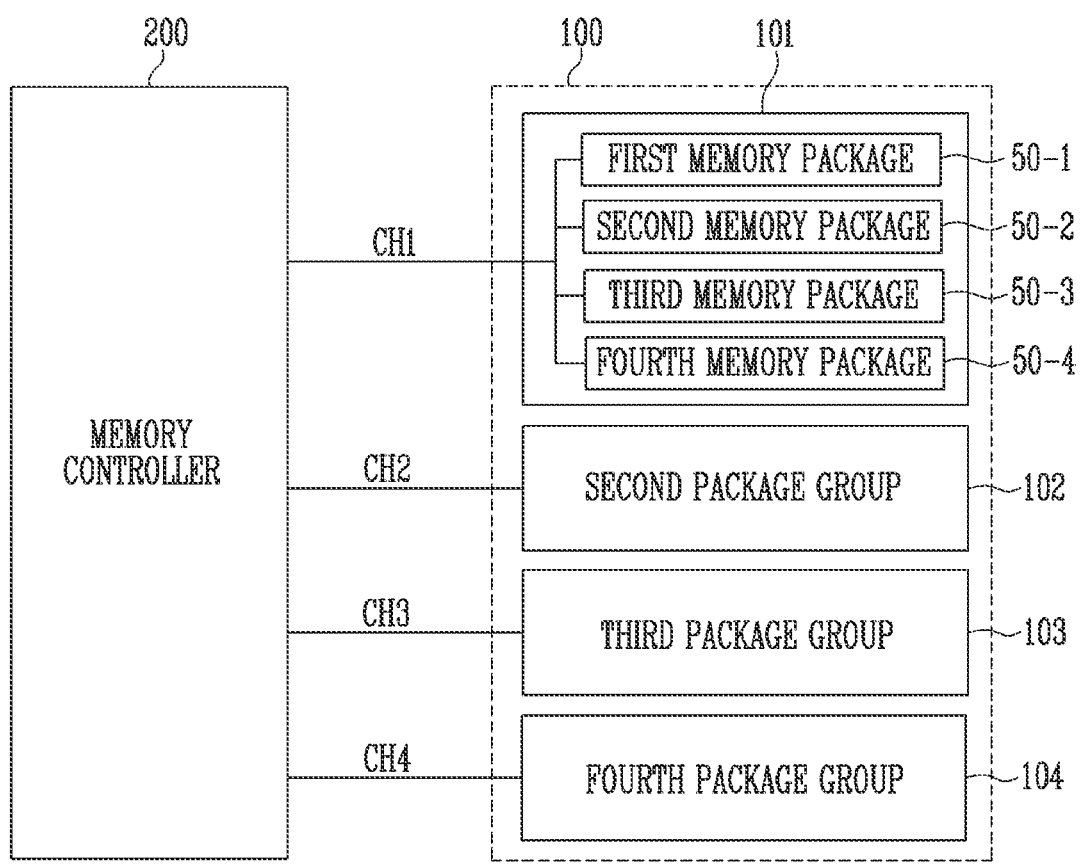
FIG. 3 is a diagram illustrating a memory device in accordance with an embodiment of the present disclosure.

FIG. 3 is a diagram illustrating a memory device in accordance with an embodiment of the present disclosure.

Referring to FIG. 3, the memory device 100 is illustrated, which is connected to the memory controller 200 through first to fourth channels CH1 to CH4.

The memory device 100 may include a plurality of package groups. For example, the memory device 100 may include first to fourth package groups 101 to 104. The package group may be a set of packages connected to the same channel. Specifically, the first package group 101 may include a first memory package 50-1, a second memory package 50-2, a third memory package 50-3, and a fourth memory package 50-4. In addition, the first to fourth memory packages 50-1 to 50-4 may be connected to the first channel CH1.

The memory device 100 may communicate with the memory controller 200 by using a plurality of channels. Specifically, the first package group 101 may communicate with the memory controller 200 by using the first channel CH1. The first to fourth memory packages 50-1 to 50-4 may also communicate with the memory controller 200 by using the first channel CH1. In addition, the second package group 102 may communicate with the memory controller 200 by using the second channel CH2. In addition, the third package group 103 and the fourth package group 104 may communicate with the memory controller 200 by respectively using the third channel CH3 and the fourth channel CH4.

Although only four channels are illustrated in FIG. 3, this is for convenience of description, and the present disclosure may be implemented with 8 channels, 16 channels, 32 channels, or the like. Also, although a form in which four memory packages are included in one package group is illustrated in FIG. 3, the present disclosure may be implemented with a larger number of memory packages.

Figure 4:
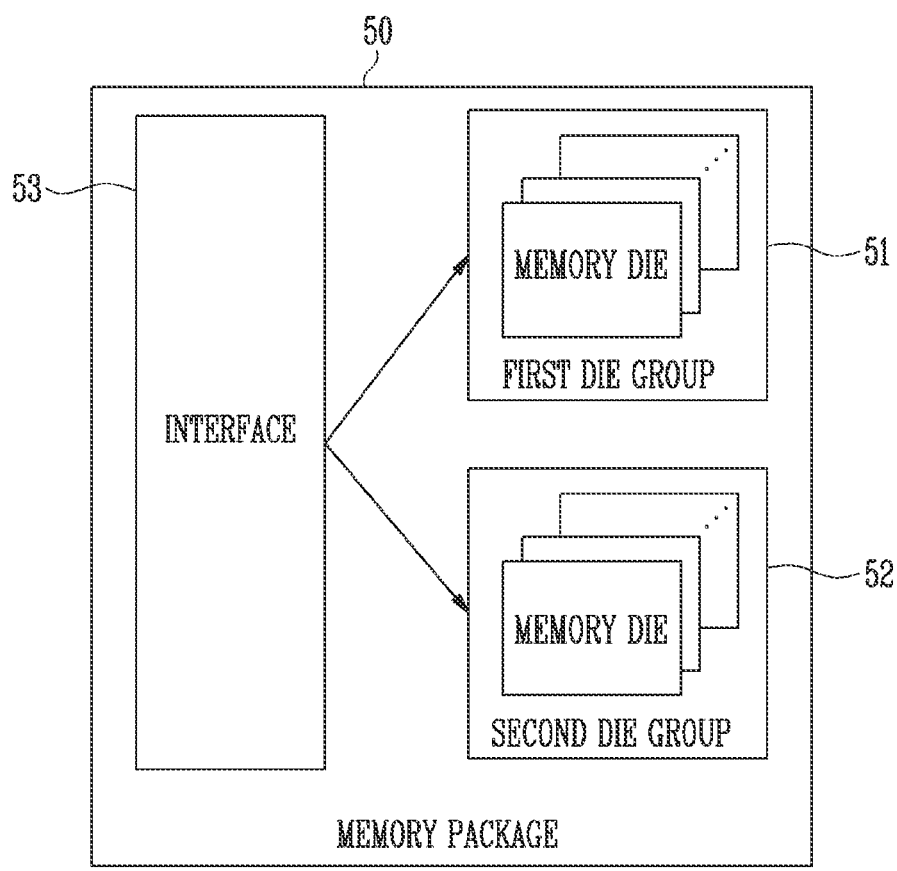
FIG. 4 is a diagram illustrating a memory package in accordance with an embodiment of the present disclosure.

FIG. 4 is a diagram illustrating a memory package in accordance with an embodiment of the present disclosure.

Referring to FIG. 4, the memory package 50 may include a first die group 51, a second die group 52, and an interface 53.

The first die group 51 may include a plurality of memory dies. The memory die may include a plurality of memory cells. The memory die may independently perform a write operation of storing data in a memory cell, a read operation of reading data stored in a memory cell, and an erase operation of erasing data stored in a memory cell.

The interface 53 may be connected to the memory controller 200 and a plurality of dies. For example, the interface 53 may be connected to a plurality of memory dies included in the first die group 51 and the second die group 52, and the memory controller 200. Also, the interface 53 may receive a signal from the memory controller 200, and allocate the received signal. Specifically, the interface 53 may identify a die group addressed by the signal received from the memory controller 200. For example, when the interface 53 receives a signal from the memory controller 200, the interface 53 may identify which one of the first die group 51 and the second die group 52 is addressed. Furthermore, the interface 53 may include a multiplexer to allocate a signal received from the outside.

Figure 5:
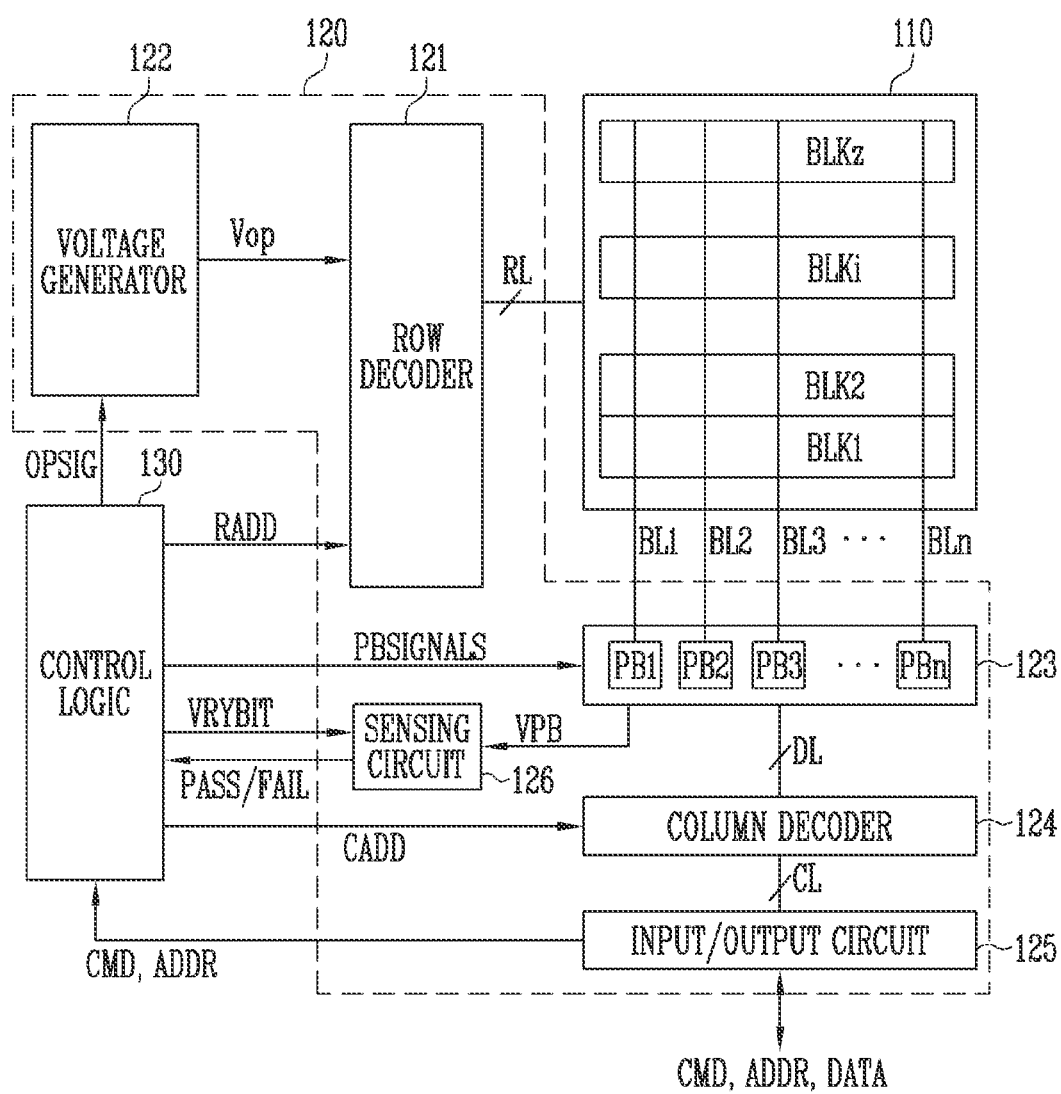
FIG. 5 is a diagram illustrating a memory die in accordance with an embodiment of the present disclosure.

FIG. 5 is a diagram illustrating a memory die in accordance with an embodiment of the present disclosure.

Referring to FIG. 5, a memory die D1 is illustrated, which includes a memory cell array 110, a peripheral circuit 120, and a control logic 130.

The memory cell array 110 includes a plurality of memory blocks BLK1 to BLKz. The plurality of memory blocks BLK1 to BLKz are connected to a row decoder 121 through row lines RL. The row lines RL may include at least one source select line, a plurality of word lines, and at least one drain select line. The plurality of memory blocks BLK1 to BLKz are connected to a page buffer group 123 through bit lines BL1 to BLn. Each of the plurality of memory blocks BLK1 to BLKz includes a plurality of memory cells. In an embodiment, the plurality of memory cells may be nonvolatile memory cells. Memory cells connected to the same word line may be defined as one page. Therefore, one memory block may include a plurality of pages.

Each of the memory cells included in the memory cell array 110 may be configured as a Single Level Cell (SLC) storing one data bit, a Multi-Level Cell (MLC) storing two data bits, a Triple Level Cell (TLC) storing three data bits, or a Quadruple Level Cell (QLC) storing four data bits.

The peripheral circuit 120 may be configured to perform a program operation, a read operation or an erase operation on a selected area of the memory cell array 110 under the control of the control logic 130. That is, the peripheral circuit 120 may drive the memory cell array 110 under the control of the control logic 130. For example, the peripheral circuit 120 may apply various operating voltages to the row lines RL and the bit lines BL1 to BLn or discharge the applied voltages under the control of the control logic 130.

Specifically, the peripheral circuit 120 may include the row decoder 121, a voltage generator 122, the page buffer group 123, a column decoder 124, an input/output circuit 125, and a sensing circuit 126.

The row decoder 121 may be connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 may receive a row address RADD from the control logic 130. Specifically, the row decoder 121 may decode the row address RADD. The row decoder 121 may select at least one memory block among the memory blocks BLK1 to BLKz according to the decoded address. Also, the row decoder 121 may select at least one word line WL of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage higher than the verify voltage to the unselected word lines. In a read operation, the row decoder 121 may apply a read voltage to the selected word line, and apply a read pass voltage higher than the read voltage to the unselected word lines.

In an embodiment, an erase operation of the memory device 100 may be performed in a memory block unit. In the erase operation, the row decoder 121 may select one memory block according to the decoded address. In the erase operation, the row decoder 121 may apply a ground voltage to word lines connected to the selected memory block.

The voltage generator 122 may operate under the control of the control logic 130. Specifically, the voltage generator 122 may generate a plurality of voltages by using an external power voltage supplied to the memory device 100 under the control of the control logic 130. For example, the voltage generator 122 may generate a program voltage, a verify voltage, a pass voltage, a read voltage, an erase voltage, and the like under the control of the control logic 130. That is, the voltage generator 122 may generate various operating voltages Vop used in program, read, and erase operations in response to an operation signal OPSIG.

In an embodiment, the voltage generator 122 may generate an internal power voltage by regulating the external power voltage. The internal power voltage generated by the voltage generator 122 may be used as an operation voltage of the memory cell array 110.

In an embodiment, the voltage generator 122 may generate a plurality of voltages by using the external power voltage or the internal power voltage. For example, the voltage generator 122 may include a plurality of pumping capacitors for receiving the internal power voltage, and generate the plurality of voltages by selectively activating the plurality of pumping capacitors under the control of the control logic 130. In addition, the plurality of generated voltages may be supplied to the memory cell array 110 by the row decoder 121.

The page buffer group 123 may include first to nth page buffers PB1 to PBn. The first to nth page buffers PB1 to PBn may be connected to the memory cell array 110 respectively through first to nth bit lines BL1 to BLn. Also, the first to nth bit lines BL1 to BLn may operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense a voltage or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. A memory cell connected to a bit line to which a program allow voltage (e.g., a ground voltage) is applied may have an increased threshold voltage. A threshold voltage with respect to a memory cell connected to a bit line to which a program inhibit voltage (e.g., a power voltage) is applied may be maintained.

In a program verify operation, the first to nth page buffers PB1 to PBn may read page data from the selected memory cells through the first to nth bit lines BL1 to BLn.

In a read operation, the first to nth page buffers PB1 to PBn may read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may communicate data between the input/output circuit 125 and the page buffer group 123 in response to a column address CADD. For example, the column decoder 124 may communicate data with the first to nth page buffers PB1 to PBn through data lines DL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 126 may generate a reference current in response to an allow bit VRYBIT signal, and output a pass signal PASS or a fail signal FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR.

Also, the control logic 130 may determine whether the verify operation has passed or failed in response to the pass or fail signal PASS or FAIL. The control logic 130 may control the page buffer group 123 to temporarily store verify information including the pass or fail signal PASS or FAIL in the page buffer group 123. Specifically, the control logic 130 may determine a program state of a memory cell in response to the pass or fail signal PASS or FAIL. For example, when the memory cell operates as a Triple Level Cell (TLC), the control logic 130 may determine whether the program state of the memory cell is an erase state E or one of first to seventh program states P1 to P7.

Figure 6:
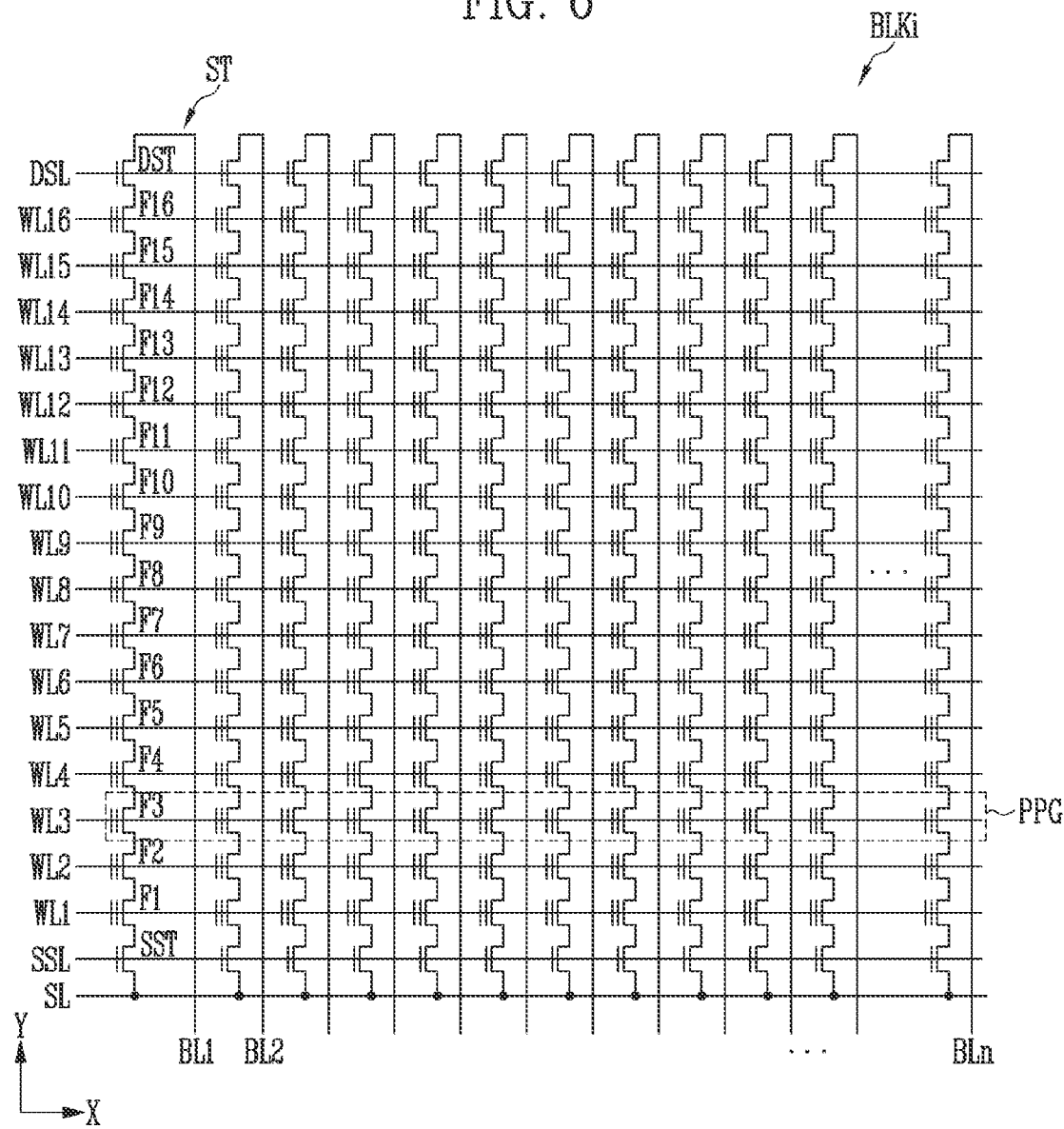
FIG. 6 is a diagram illustrating a memory block in accordance with an embodiment of the present disclosure.

FIG. 6 is a diagram illustrating a memory block in accordance with an embodiment of the present disclosure.

Referring to FIG. 6, in the memory block BLKi, a plurality of word lines arranged in parallel to each other may be connected between a first select line and a second select line. The first select line may be a source select line SSL, and the second select line may be a drain select line DSL. More specifically, the memory block BLKi may include a plurality of strings ST connected between bit lines BL1 to BLn and a source line SL. The bit lines BL1 to BLn may be respectively connected to the strings ST, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and a number of memory cells which is greater than that of the memory cells F1 to F16 shown in the drawing may be included in the one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, and gates of drain select transistors DST included in different strings ST may be connected to the drain select line DSL. Gates of the memory cells F1 to F16 may be connected to a plurality of word lines WL1 to WL16. A group of memory cells connected to the same word line among memory cells included in different strings ST may be referred to as a physical page PPG. Therefore, physical pages PPG corresponding to the number of the word lines WL1 to WL16 may be included in the memory block BLKi.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The SLC may store one-bit data. One physical page PPG of the SLC may store one logical page (LPG) data. The one LPG data may include a number of data bits which correspond to that of cells included in the one physical page PPG.

The MLC, the TLC, and the QLC may store two or more-bit data. One physical page PPG may store two or more LPG data.

Figure 7:
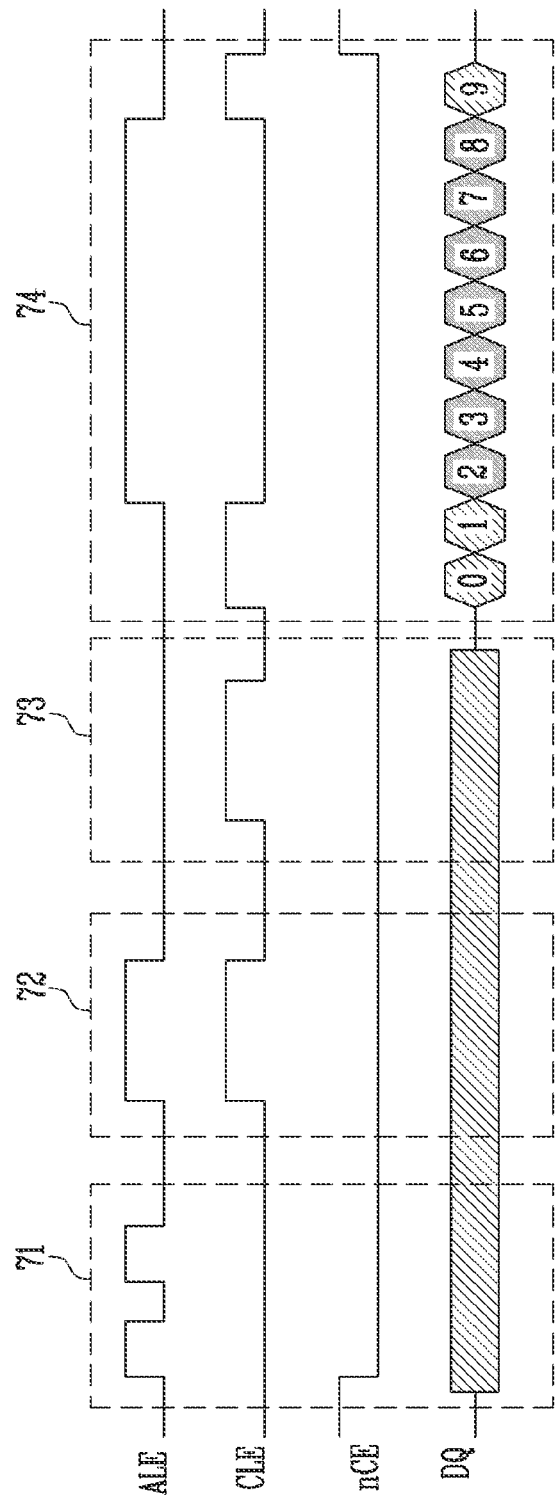
FIG. 7 is a diagram illustrating an addressing method in accordance with an embodiment of the present disclosure.

FIG. 7 is a diagram illustrating an addressing method in accordance with an embodiment of the present disclosure.

Referring to FIG. 7, an address latch enable (ALE) signal, a command latch enable (CLE) signal, a chip enable (CE) signal, and a data (DQ) signal according to a lapse of time are illustrated. The address latch enable (ALE) signal and the command latch enable (CLE) signal may be divided for each cycle.

In accordance with an embodiment of the present disclosure, the storage device 1000 may address a target memory die which becomes a target of a memory operation by using the address latch enable (ALE) signal, the command latch enable (CLE) signal, and the chip enable (CE) signal. Specifically, the storage device 1000 may address a memory die among a plurality of memory dies by using the address latch enable (ALE) signal and the command latch enable (CLE) signal, which are input during predetermined N cycles, where N is a natural number.

For example, the storage device 1000 may address the target memory die by using the address latch enable (ALE) signal and the command latch enable (CLE) signal, which are input during three cycles including first to third cycles 71 to 73.

Specifically, during the first cycle 71, when the address latch enable (ALE) signal is toggled from low to high, and the command latch enable (CLE) signal is in the low state, the address latch enable (ALE) signal and the command latch enable (CLE) signal may represent '10.' Also, the storage device 1000 may address a memory package corresponding to '10' among a plurality of memory packages by using the first cycle 71.

In addition, during the second cycle 72, when the address latch enable (ALE) signal toggles from low to high, and the command latch enable (CLE) signal is toggled from low to high, the address latch enable (ALE) signal and the command latch enable (CLE) signal may represent '11.' Also, the storage device 1000 may address an interface corresponding to '11' among a plurality of interfaces by using the second cycle 72.

In addition, during the third cycle 73, when the address latch enable (ALE) signal is in the low state, and the command latch enable (CLE) signal is toggled from low to high, the address latch enable (ALE) signal and the command latch enable (CLE) signal may represent '01.' Also, the storage device 1000 may address a memory die group corresponding to '01' among a plurality of memory die groups by using the third cycle 73.

In addition, during a fourth cycle 74, data including an address and a command may be input according to the address latch enable (ALE) signal and the command latch enable (CLE) signal. Specifically, zeroth data DQ 0 and first data DQ 1 may correspond to a command, second data DQ 2 and third data DQ 3 may correspond to a column address, fourth to eighth data DQ 4 to DQ 8 may correspond to a row address, and ninth data DQ 9 may correspond to a command. The memory device 100 may receive an address and a command during the fourth cycle 74. The memory device 100 may perform a memory operation, based on the received address and the received command.

The storage device 1000 may address one channel among a plurality of channels by using the chip enable (CE) signal. For example, the storage device 1000 may change an n-chip enable (nCE) signal from high to low, to address an nth package group connected to an nth channel.

Also, the storage device 1000 may address the target memory die by using the data DQ signal input to a data line during a predetermined cycle. That is, the storage device 1000 may address the target memory die by using the address latch enable (ALE) signal, the command latch enable (CLE) signal, and the data (DQ) signal, which are input during the first to fourth cycles 71 to 74.

In accordance with the embodiment of the present disclosure, the target memory die is addressed by using the address latch enable (ALE) signal and the command latch enable (CLE) signal, so that the number of chip address (CE) lines and chip address (CE) pins, which are required in a large-capacity memory device including a plurality of memory dies, can be decreased. For example, conventionally, six chip address (CE) lines or six chip address (CE) pins per channel were required. However, in accordance with the embodiment of the present disclosure, the target memory die can be addressed by using one chip address (CE) line or one chip address (CE) pin.

Also, in accordance with the embodiment of the present disclosure, chip address (CE) lines and chip address (CE) pins, having a number which is smaller than the number of chip address (CE) lines and chip address (CE) pins, which were conventionally required, are used. Thus, Signal Integrity (SI) and Power Integrity (PI) can be improved, and pin cost can be ensured.

Figure 8:
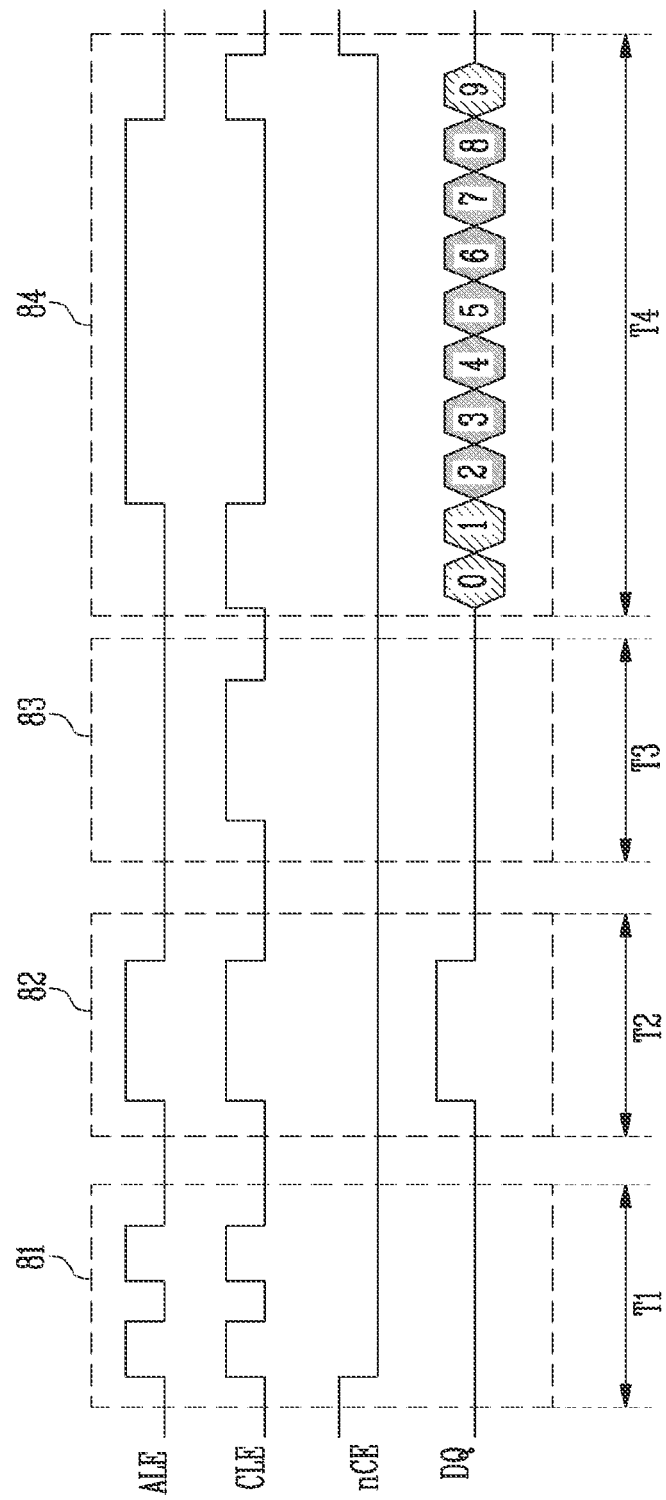
FIG. 8 is a diagram illustrating an addressing method in accordance with an embodiment of the present disclosure.

FIG. 8 is a diagram illustrating an addressing method in accordance with an embodiment of the present disclosure.

Referring to FIG. 8, an address latch enable (ALE) signal, a command latch enable (CLE) signal, a chip enable (CE) signal, and a data (DQ) signal according to a lapse of time are illustrated.

The address latch enable (ALE) signal and the command latch enable (CLE) signal may be provided over a plurality of time periods, and different targets may be addressed in the plurality of time periods. For example, a first time period 81 may be a time period in which one memory package among a plurality of memory packages is addressed, a second time period 82 may be a time period in which one interface among a plurality of interfaces is addressed, and a third time period 83 may be a time period in which one memory die group among a plurality of memory die groups is addressed.

In an embodiment, the address latch enable (ALE) signal and the command latch enable (CLE) signal may be provided over the plurality of time periods. For example, the address latch enable (ALE) signal and the command latch enable (CLE) signal, which are input during a first time, may address a target (i.e., a memory package) corresponding to the first time period 81, the address latch enable (ALE) signal and the command latch enable (CLE) signal, which are input during a second time, may address a target (i.e., an interface) corresponding to the second time period 82, and the address latch enable (ALE) signal and the command latch enable (CLE) signal, which are input during a third time and a fourth time, may address targets (i.e., a memory die group and a memory die) respectively corresponding to the third time period 83 and a fourth time period 84.

In accordance with an embodiment of the present disclosure, the storage device 1000 may address a target memory die by using the data (DQ) signal input to a data line during a predetermined time. That is, the storage device 1000 may address the target memory die by using the address latch enable (ALE) signal, the command latch enable (CLE) signal, and the data (DQ) signal, which are input during the first to fourth time T1 to T4.

Figure 9:
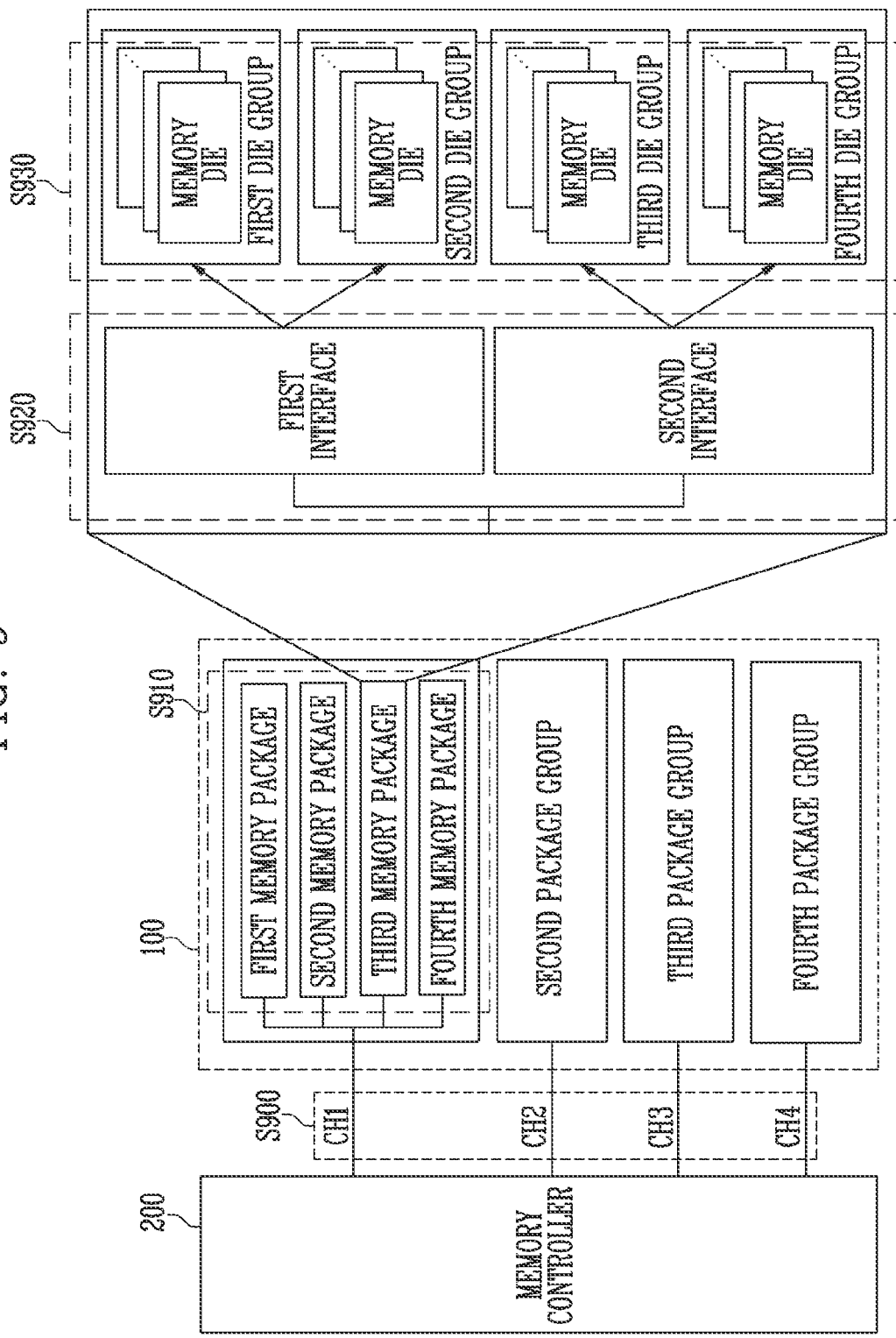
FIG. 9 is a diagram illustrating a structure of a memory device and an addressing method in accordance with an embodiment of the present disclosure.

FIG. 9 is a diagram illustrating a structure of a memory device and an addressing method in accordance with an embodiment of the present disclosure.

Referring to FIG. 9, the memory device 100 may include a plurality of package groups each including a plurality of memory packages. Specifically, the memory device 100 may include first to fourth package groups, and the first package group may include first to fourth memory packages.

In addition, the memory package may include a plurality of die groups including a plurality of memory dies, and a plurality of interfaces. For example, the third memory package may include first to fourth die groups, a first interface, and a second interface.

In accordance with an embodiment of the present disclosure, the storage device 1000 may address a channel among a plurality of channels respectively connected to the plurality of package groups by using the chip enable (CE) signal (S900).

Also, the storage device 1000 may address a memory package among the plurality of memory packages by using the address latch enable (ALE) signal and the command latch enable (CLE) signal, which are input during a predetermined cycle or a predetermined time (S910).

The storage device 1000 may address an interface among the plurality of interfaces by using the address latch enable (ALE) signal and the command latch enable (CLE) signal, which are input during a predetermined cycle or a predetermined time (S920).

The storage device 1000 may address a die group among the plurality of die groups by using the address latch enable (ALE) signal and the command latch enable (CLE) signal, which are input during a predetermined cycle or a predetermined time (S930).

Figure 10:
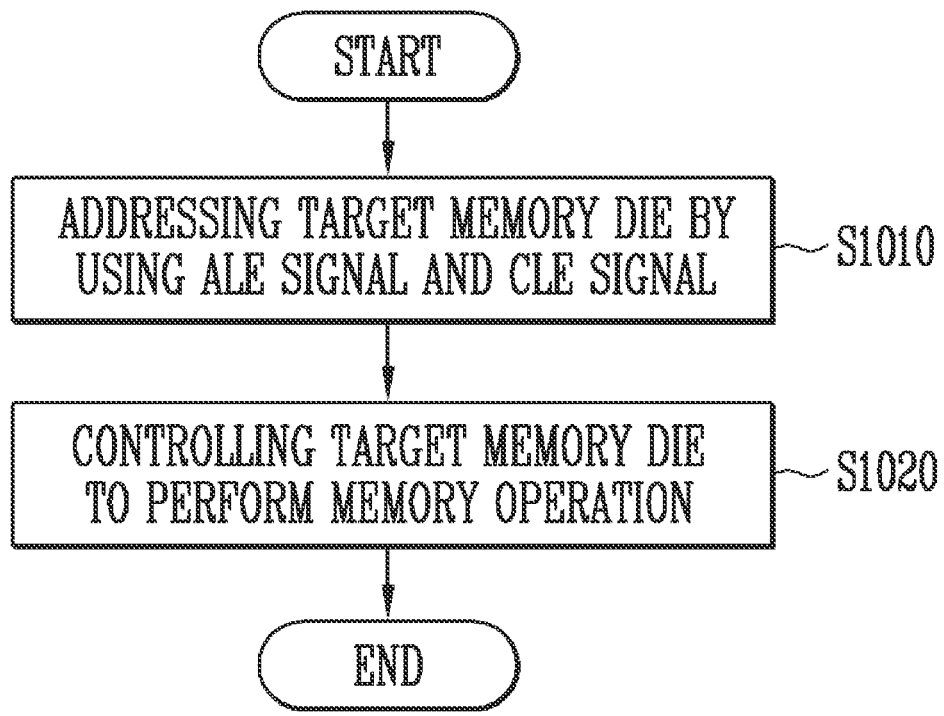
FIG. 10 is a diagram illustrating an operating method of the storage device in accordance with an embodiment of the present disclosure.

FIG. 10 is a diagram illustrating an operating method of the storage device in accordance with an embodiment of the present disclosure.

Referring to FIG. 10, an operating method of the storage device 1000 including a plurality of memory dies is illustrated.

The storage device 1000 may address a target memory die by using an address latch enable (ALE) signal and a command latch enable (CLE) signal (S1010). Specifically, the storage device 1000 may address a memory die among the plurality of memory dies by using the address latch enable (ALE) signal and the command latch enable (CLE) signal, which are input during predetermined N cycles, where N is a natural number. The addressing may mean an operation representing an address at which a memory operation is to be performed.

In accordance with an embodiment of the present disclosure, the storage device 1000 may address a channel among a plurality of channels respectively connected to a plurality of package groups by using a chip enable (CE) signal in the addressing of the memory die.

In accordance with an embodiment of the present disclosure, the storage device 1000 may further address a memory package among a plurality of memory packages by using the address latch enable (ALE) signal and the command latch enable (CLE) signal, which are input during at least one cycle, in the addressing of the memory die.

In accordance with an embodiment of the present disclosure, the storage device 1000 may further address a memory die group among a plurality of memory die groups by using the address latch enable (ALE) signal and the command latch enable (CLE) signal, which are input during at least one cycle, in the addressing of the memory die.

In accordance with an embodiment of the present disclosure, the storage device 1000 may further address an interface among a plurality of interfaces by using the address latch enable (ALE) signal and the command latch enable (CLE) signal, which are input during at least one cycle, in the addressing of the memory die.

In accordance with an embodiment of the present disclosure, the storage device 1000 may further address a memory package among the plurality of memory packages by using the address latch enable (ALE) signal and the command latch enable (CLE) signal, which are input during a first cycle, further address an interface among the plurality of interfaces by using the address latch enable (ALE) signal and the command latch enable (CLE) signal, which are input during a second cycle, and further address a memory die group among the plurality of memory die groups by using the address latch enable (ALE) signal and the command latch enable (CLE) signal, which are input during a third cycle, in the addressing of the memory die.

In accordance with an embodiment of the present disclosure, the storage device 1000 may address the memory die by further using a data (DQ) signal input during the predetermined N cycles, where N is a natural number.

The storage device 1000 may control the target memory die such that the memory device 100 performs the memory operation (S1020). Specifically, the storage device 1000 may transmit data including an address and a command to the memory device 100 by using a data line such that the target memory die performs the memory operation. The memory operation may include a write operation (program operation), a read operation, and an erase operation. The program operation may be an operation in which a memory die records data in a region selected by an address. The read operation may mean an operation in which a memory die reads data from a region selected by an address. The erase operation may mean an operation in which a memory die erases data stored in a region selected by an address.

Figure 11:
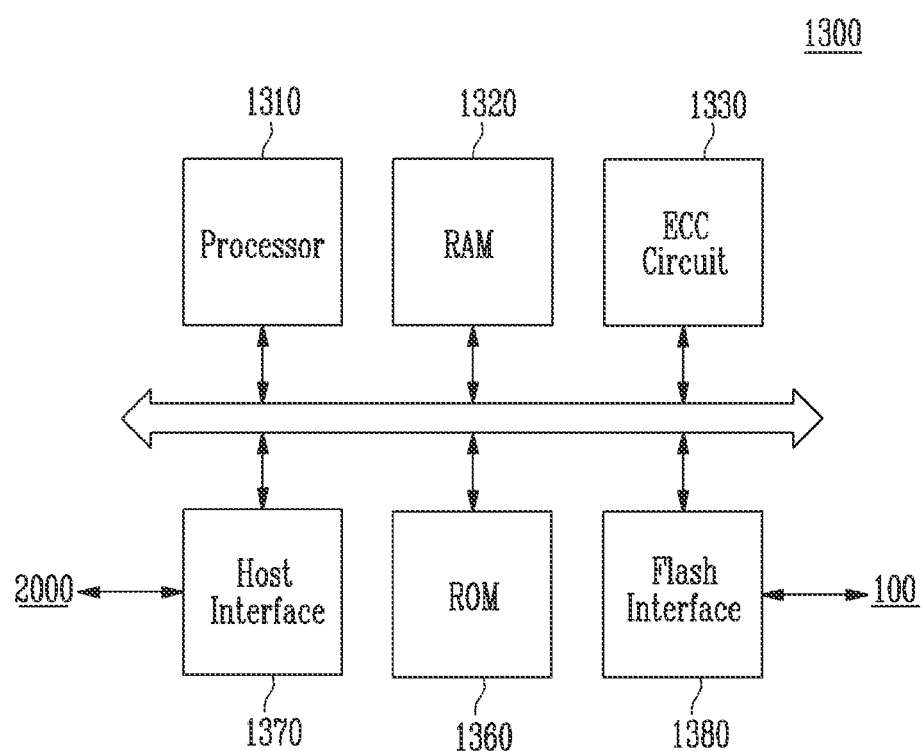
FIG. 11 is a diagram illustrating a memory controller in accordance with an embodiment of the present disclosure.

FIG. 11 is a diagram illustrating a memory controller in accordance with an embodiment of the present disclosure.

Referring to FIG. 11, the memory controller 1300 may include a processor 1310, a RAM 1320, and an ECC circuit 1330, a ROM 1360, a host interface 1370, and a flash interface 1380. The memory controller 1300 shown in FIG. 11 may be an embodiment of the memory controller 200 shown in FIG. 1.

The processor 1310 may communicate with the host 2000 by using the host interface 1370, and perform a logical operation to control an operation of the memory controller 1300. For example, the processor 1310 may load a program command, a data file, a data structure, etc., based on a request received from the host 2000 or an external device, and perform various operations or generate a command and an address. For example, the processor 1310 may generate various commands necessary for a program operation, a read operation, an erase operation, a suspend operation, and a parameter setting operation.

Also, the processor 1310 may perform a function of a Flash Translation Layer (FTL). The processor 250 may translate a Logical Block Address (LBA) provided by the host 2000 into a Physical Block Address (PBA) through the FTL. The FTL may receive an LBA input by using a mapping table, to translate the LBA into a PBA. Several address mapping methods of the FTL exist according to mapping units. A representative address mapping method includes a page mapping method, a block mapping method, and a hybrid mapping method.

Also, the processor 1310 may generate a command without any request from the host 2000. For example, the processor 1310 may generate a command for background operations such as operations for wear leveling of the memory device 100 and operations for garbage collection of the memory device 100.

The RAM 1320 may be used as a buffer memory, a working memory, or a cache memory of the processor 1310. Also, the RAM 1320 may store codes and commands, which the processor 1310 executes. The RAM 1320 may store data processed by the processor 1310. Also, the RAM 1320 may be implemented with a Static RAM (SRAM) or a Dynamic RAM (DRAM).

The ECC circuit 1330 may detect an error in a program operation or a read operation, and correct the detected error. Specifically, the ECC circuit 1330 may perform an error correction operation according to an Error Correction Code (ECC). Also, the ECC circuit 1330 may perform ECC encoding, based on data to be written to the memory device 100. The data on which the ECC encoding is performed may be transferred to the memory device 100 through the flash interface 1380. Also, the ECC circuit 1330 may perform ECC decoding on data received from the memory device 100 through the flash interface 1380.

The ROM 1360 may be used as a storage unit for storing various information necessary for an operation of the memory controller 1300. Specifically, the ROM 1360 may include a map table, and physical-to-logical address information. Furthermore, logical-to-physical address information may be stored in the map table. Also, the ROM 1360 may be controlled by the processor 1310.

The host interface 1370 may include a protocol for exchanging data between the host 2000 and the memory controller 1300. Specifically, the host interface 1370 may communicate with the host 2000 through at least one of various communication standards or interfaces such as a Universal Serial Bus (USB) protocol, a Multi-Media Card (MMC) protocol, a Peripheral Component Interconnection (PCI) protocol, a PCI-Express (PCI-e or PCIe) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The flash interface 1380 may communicate with the memory device 100 by using a communication protocol under the control of the processor 1310. Specifically, the flash interface 1380 may communicate a command, an address, and data with the memory device 100 through a channel. For example, the flash interface 1380 may include a NAND interface.

Figure 12:
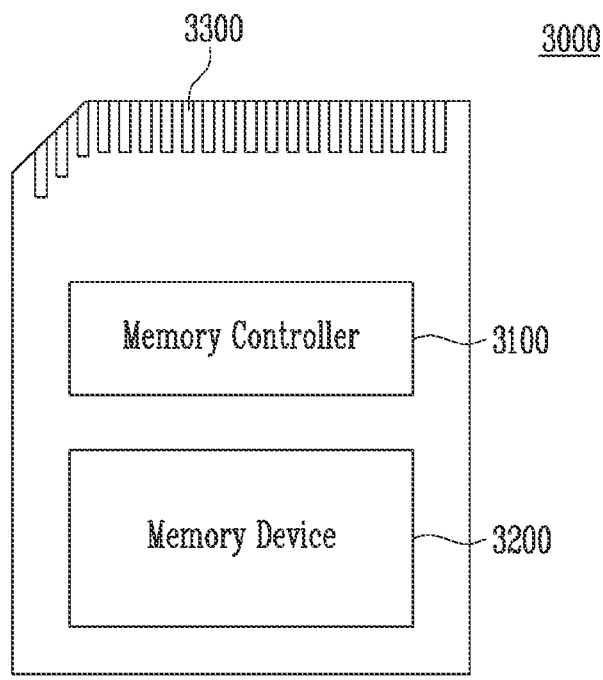
FIG. 12 is a diagram illustrating a memory card system in accordance with an embodiment of the present disclosure.

FIG. 12 is a diagram illustrating a memory card system in accordance with an embodiment of the present disclosure.

Referring to FIG. 12, the memory card system 3000 includes a memory controller 3100, a memory device 3200, and a connector 3300.

The memory controller 3100 may be connected to the memory device 3200. The memory controller 3100 may access the memory device 3200. For example, the memory controller 3100 may control read, write, erase, and background operations on the memory device 3200. The memory controller 3100 may provide an interface between the memory device 3200 and a host. Also, the memory controller 3100 may drive firmware for controlling the memory device 3200.

For example, the memory controller 3100 may include components such as a Random Access Memory (RAM), a processing unit, a host interface, a memory interface, and the error corrector.

The memory controller 3100 may communicate with an external device through the connector 3300. The memory controller 3100 may communicate with the external device (e.g., the host) according to a specific communication protocol. The memory controller 3100 may communicate with the external device through at least one of various communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

The memory device 3200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 3100 and the memory device 3200 may be integrated into a single semiconductor device, to constitute a memory card. For example, the memory controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 13:
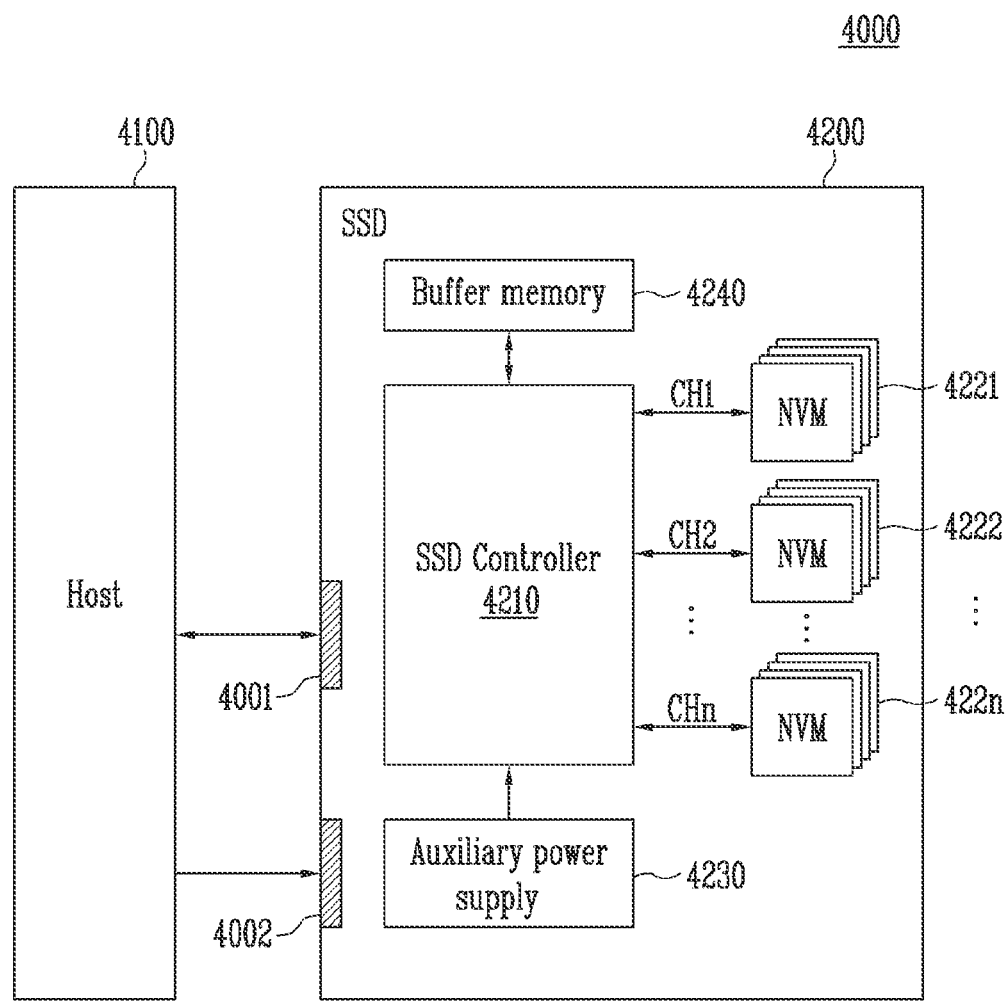
FIG. 13 is a diagram illustrating a Solid State Drive (SSD) in accordance with an embodiment of the present disclosure.

FIG. 13 is a diagram illustrating a Solid State Drive (SSD) in accordance with an embodiment of the present disclosure.

Referring to FIG. 13, the SSD system 4000 includes a host 4100 and an SSD 4200. The SSD 4200 exchanges a signal SIG with the host 4100 through a signal connector 4001, and receives power PWR through a power connector 4002. The SSD 4200 includes an SSD controller 4210, a plurality of flash memories 4221 to 422n, an auxiliary power supply 4230, and a buffer memory 4240.

In an embodiment, the SSD controller 4210 may serve as the memory controller 200 described with reference to FIG. 1. The SSD controller 4210 may control the plurality of flash memories 4221 to 422n in response to a signal SIG received from the host 4100. The signal SIG may be a signal based on an interface between the host 4100 and the SSD 4200. For example, the signal SIG may be a signal defined by at least one of communication standards or interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a Wi-Fi, a Bluetooth, and an NVMe.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power to the SSD 4200. The auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of flash memories 4221 to 422n, or temporarily store meta data (e.g., a mapping table) of the flash memories 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

Figure 14:
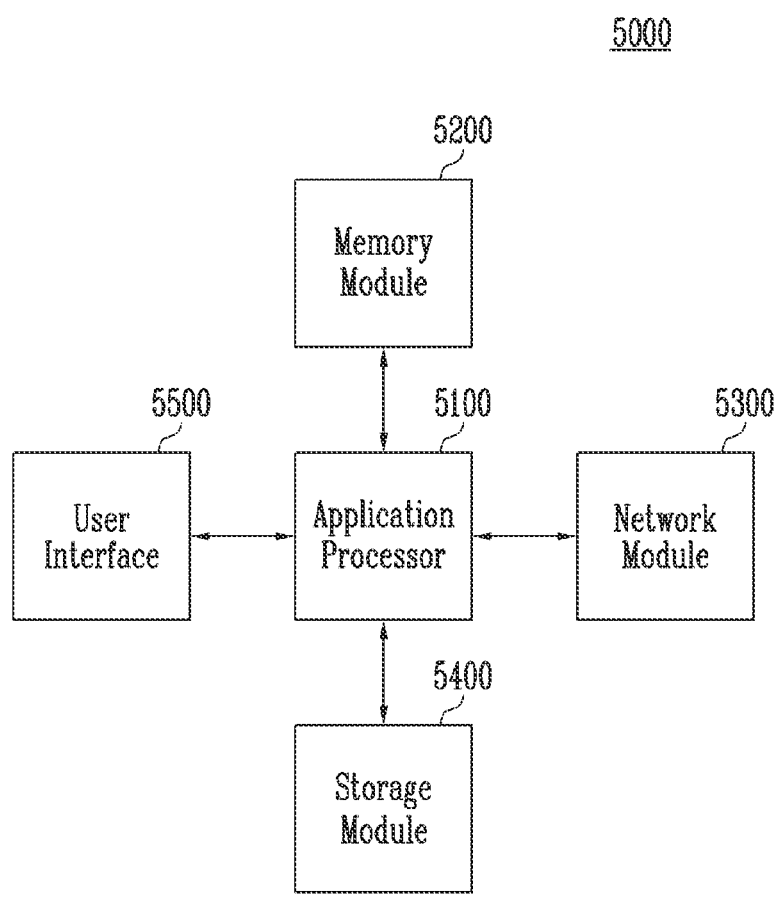
FIG. 14 is a diagram illustrating a user system in accordance with an embodiment of the present disclosure.

FIG. 14 is a diagram illustrating a user system in accordance with an embodiment of the present disclosure.

Referring to FIG. 14, the user system 5000 includes an application processor 5100, a memory module 5200, a network module 5300, a storage module 5400, and a user interface 5500.

The application processor 5100 may drive components included in the user system 5000, an operating system (OS), a user program, or the like. The application processor 5100 may include controllers for controlling components included in the user system 5000, interfaces, a graphic engine, and the like. The application processor 5100 may be provided as a System-on-Chip (SoC).

The memory module 5200 may operate as a main memory, working memory, buffer memory or cache memory of the user system 5000. The memory module 5200 may include volatile random access memories such as a DRAM, an SDRAM, a DDR SDRAM, a DDR2 SDRAM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. The application processor 5100 and the memory module 5200 may be provided as one semiconductor package by being packaged based on a Package on Package (PoP).

The network module 5300 may communicate with external devices. The network module 5300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), WiMAX, WLAN, UWB, Bluetooth, and Wi-Fi. The network module 5300 may be included in the application processor 5100.

The storage module 5400 may store data. For example, the storage module 5400 may store data received from the application processor 5100. Alternatively, the storage module 5400 may transmit data stored therein to the application processor 5100. The storage module 5400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. The storage module 5400 may be provided as a removable drive such as a memory card of the user system 5000 or an external drive.

The storage module 5400 may include a plurality of nonvolatile memory devices, and the plurality of nonvolatile memory devices may operate identically to the memory device 100 described with reference to FIGS. 1 to 6. The storage module 5400 may operate identically to the storage device 1000 described with reference to FIG. 1.

The user interface 5500 may include interfaces for inputting data or commands to the application processor 5100 or outputting data to an external device. The user interface 5500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with embodiments of the present disclosure, there can be provided a storage device for supporting improved addressing for a high capacity memory and an operating method of the storage device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all operations may be selectively performed or part of the operations may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Moreover, the embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein and the following claims. Furthermore, the embodiments may be combined to form additional embodiments.

What is claimed is:

1. A storage device comprising:
    a memory device including a plurality of memory dies and a plurality of interfaces connected to the plurality of memory dies; and
    a memory controller configured to:
    address a memory die among the plurality of memory dies by providing the memory device with an address value comprising a two bit combination of a logical value of an address latch enable (ALE) signal and a logical value of a command latch enable (CLE) signal, and
    control the memory device such that the memory die performs a memory operation,
    wherein the memory controller addresses the memory die by addressing a channel among a plurality of channels respectively connected to a plurality of package groups by using a logical value of a chip enable (CE) signal,
wherein the logical value of the address latch enable (ALE) signal and the logical value of the command latch enable (CLE) signal are input to the plurality of interfaces during predetermined N cycles, where N is a natural number.

2. The storage device of claim 1,
wherein each of the plurality of package groups includes a plurality of memory packages, and
wherein each of the plurality of memory packages includes:
a plurality of die groups each including the plurality of memory dies; and
one or more interfaces among the plurality of interfaces each configured to connect corresponding die groups of the plurality of die groups to the memory controller.

3. The storage device of claim 2, wherein the memory controller addresses the memory die by addressing a memory package among the plurality of memory packages by using the logical value of the address latch enable (ALE) signal and the logical value of the command latch enable (CLE) signal during at least one cycle of the predetermined N cycles.

4. The storage device of claim 2, wherein the memory controller addresses the memory die by addressing a die group among the plurality of die groups by using the logical value of the address latch enable (ALE) signal and the logical value of the command latch enable (CLE) signal during at least one cycle.

5. The storage device of claim 2, wherein the memory controller addresses the memory die by addressing an interface among the plurality of interfaces by using the logical value of the address latch enable (ALE) signal and the logical value of the command latch enable (CLE) signal during at least one cycle.

6. The storage device of claim 2, wherein the memory controller addresses the memory die by further addressing:
a memory package among the plurality of memory packages by using the logical value of the address latch enable (ALE) signal and the logical value of the command latch enable (CLE) signal during a first cycle of the predetermined N cycles,
an interface among a plurality of interfaces by using the logical value of the address latch enable (ALE) signal and the logical value of the command latch enable (CLE) signal during a second cycle of the predetermined N cycles, and
a die group among the plurality of die groups by using the logical value of the address latch enable (ALE) signal and the logical value of the command latch enable (CLE) signal during a third cycle of the predetermined N cycles.

7. The storage device of claim 1, wherein the memory controller addresses the memory die by using a logical value of a data (DQ) signal during the predetermined N cycles.

8. A storage device comprising:
a memory device including a plurality of memory dies and a plurality of interfaces connected to the plurality of memory dies; and
a memory controller configured to provide an address latch enable (ALE) signal, a command latch enable (CLE) signal, and a chip enable (CE) signal to the plurality of interfaces during a predetermined time,
wherein the plurality of interfaces address a memory die among the plurality of memory dies by using an address value comprising a two bit combination of a logical value of the address latch enable signal and a logical value of the command latch enable signal.

9. The storage device of claim 8,
wherein each of a plurality of package groups includes a plurality of memory packages, and
wherein each of the plurality of memory packages includes:
a plurality of die groups each including the plurality of memory dies; and
one or more interfaces among the plurality of interfaces each configured to connect corresponding die groups of the plurality of die groups to the memory controller.

10. The storage device of claim 9, wherein the plurality of interfaces are configured to address a memory package among the plurality of memory packages based on the logical value of the address latch enable (ALE) signal and the logical value of the command latch enable (CLE) signal, which are input during a first time in the predetermined time.

11. The storage device of claim 9, wherein the plurality of interfaces are configured to address a die group among the plurality of die groups based on the logical value of the address latch enable (ALE) signal and the logical value of the command latch enable (CLE) signal, which are input during a second time in the predetermined time.

12. The storage device of claim 9 wherein the plurality of interfaces are configured to address an interface among the plurality of interfaces based on the logical value of the address latch enable (ALE) signal and the logical value of the command latch enable (CLE) signal, which are input during a third time in the predetermined time.

13. The storage device of claim 9, wherein the plurality of interfaces address the memory die by addressing a channel among a plurality of channels respectively connected to the plurality of package groups based on a logical value of the chip enable (CE) signal and by using a data (DQ) signal input to a data line during the predetermined time.

14. The storage device of claim 13, wherein the memory controller controls the memory device to perform the memory operation by transmitting data including an address and a command to the data line such that the memory die performs the memory operation after the predetermined time.

15. A method of operating a storage device including a plurality of memory dies and a plurality of interfaces connected to the plurality of memory dies, the method comprising:
addressing a memory die among the plurality of memory dies by using an address value comprising a two bit combination of a logical value of an address latch enable (ALE) signal and a logical value of a command latch enable (CLE) signal, which are input to the plurality of interfaces during predetermined N cycles, where N is a natural number; and
controlling the memory die to perform a memory operation,
wherein the addressing of the memory die includes addressing a channel corresponding to the memory die among a plurality of channels respectively connected to a plurality of package groups by using a logical value of a chip enable (CE) signal.

16. The method of claim 15, wherein the addressing of the memory die further includes addressing a memory package among a plurality of memory packages by using the logical value of the address latch enable (ALE) signal and the logical value of the command latch enable (CLE) signal during at least one cycle.

17. The method of claim 15, wherein the addressing of the memory die further includes addressing a memory die group among a plurality of memory die groups by using the logical value of the address latch enable (ALE) signal and the logical value of the command latch enable (CLE) signal during at least one cycle.

18. The method of claim 15, wherein the addressing of the memory die further includes addressing an interface among the plurality of interfaces by using the logical value of the address latch enable (ALE) signal and the logical value of the command latch enable (CLE) signal, which are input during at least one cycle.

19. The method of claim 15, wherein the addressing of the memory die further includes addressing:
- a memory package among a plurality of memory packages by using the logical value of the address latch enable (ALE) signal and the logical value of the command latch enable (CLE) signal, which are input during a first cycle,
- an interface among the plurality of interfaces by using the logical value of the address latch enable (ALE) signal and the logical value of the command latch enable (CLE) signal, which are input during a second cycle, and
- a die group among a plurality of die groups by using the logical value of the address latch enable (ALE) signal and the logical value of the command latch enable (CLE) signal, which are input during a third cycle.

20. The method of claim 15, wherein the memory die is addressed by further using a data (DQ) signal input during the N cycles.

21. An operating method of a memory device, the operating method comprising:
- selecting, in response to an address value comprising a two bit combination of a logical value of a chip enable (CE) signal from a controller, a package group of a plurality of package groups included in the memory device;
- selecting sequentially, in response to respective toggles of a logical value of an address latch enable (ALE) signal and a logical value of a command latch enable (CLE) signal from the controller during first to third time periods, a memory package within the selected package group, an interface within the selected memory package and a memory die group coupled to the selected interface; and
- performing, in response to a combination of a data (DQ) signal and the ALE and CLE signals during a fourth time period, an operation on a memory die within the selected memory die group.

22. An operating method of a controller, the operating method comprising:
- selecting, by providing a memory device with an address value determined based on a combination of a logical value of a chip enable (CE) signal, a package group of a plurality of package groups included in the memory device;
- selecting sequentially, by providing the memory device with respective toggles of a logical value of an address latch enable (ALE) signal and a logical value of a command latch enable (CLE) signal during first to third time periods, a memory package within the selected package group, an interface within the selected memory package and a memory die group.

* * * * *